United States Patent [19]

Dohi et al.

[11] Patent Number: 4,782,301

[45] Date of Patent: Nov. 1, 1988

[54] FUSE INSPECTION DEVICE

[75] Inventors: Hikoo Dohi; Akihiko Fujita; Ryuetsu Oikawa, all of Kosai, Japan

[73] Assignee: Yazaki Corporation, Tokyo, Japan

[21] Appl. No.: 939,801

[22] Filed: Dec. 9, 1986

[30] Foreign Application Priority Data

Dec. 27, 1985 [JP] Japan ................................ 60-292913

[51] Int. Cl.$^{4}$ .................... H01H 85/32; G01R 31/02; G08B 21/00

[52] U.S. Cl. ................................ 324/550; 324/158 R; 340/639

[58] Field of Search ................. 324/158 R, 73 R, 550; 340/638, 639; 337/241

[56] References Cited

U.S. PATENT DOCUMENTS 2,623,099 12/1952 Wallace et al. ..................... 324/550
2,735,088 2/1956 Kinzer ................................. 340/639
4,382,225 5/1983 Peltz ................................... 324/550
4,514,723 4/1985 Leal .................................... 337/241

FOREIGN PATENT DOCUMENTS 0142478 7/1977 Japan .

*Primary Examiner*—Ernest F. Karlsen

*Attorney, Agent, or Firm*—Armstrong, Nikaido, Marmelstein & Kubovcik

[57] ABSTRACT

A fuse inspection device having receiving terminals which are arranged in a longitudinal direction of a fuse box body and with which a plurality of band fuses are held in fit engagement. Windows are provided in side walls of accommodating chambers for the respective receiving terminals, and a slide knob slides along the band fuses. A sensing terminal moves together with the slide knob and has one end electrically connected with the receiving terminals through the window and has the other end brought into contact with a common conductive member. Electric conduction states of the band fuses are successively sensed by electrically connecting the sensing terminal and the receiving terminals through the movement of the slide knob. A plurality of connecting terminals each of which has one end held in contact with the corresponding receiving terminal through the window are arranged in ascendible fashion in the fuse box body and in a moving direction of the slide knob so that when one end of the sensing terminal has come into contact with any of the connecting terminals, the contact pressure between the other end of the sensing terminal and the conductive member rises, thereby to reliably sense the conduction state of the fuse.

5 Claims, 5 Drawing Sheets

FUSE INSPECTION DEVICE

BACKGROUND OF THE INVENTION

The present invention relates to a device in a fuse block for use in the electric accessory circuits of an automobile etc., in which the presence or absence of the fusing of band fuses is sensed under the mounted states of the fuses for operation.

Heretofore, a fuse inspection device of this type as shown in FIGS. 6 thru 9 has been proposed (Japanese Utility Model Registration Application Laid-Open No. 56-142478).

This device is provided with a recess 2 in the longitudinal direction of a fuse box body 1. A plurality of sets of receiving terminals 4 and 4' on a power source side and a load side with which band fuses 3 are brought into fit engagement are arranged in the side walls of the recess, and the side walls are provided with windows 5 in correspondence with the respective receiving terminals 4' so as to expose these receiving terminals 4'. Protrudible contact pieces 7 and 7' made of a conductive spring material are mounted in a slider 6 which is adapted to slide along the recess 2, and a coupling terminal **7*a* which connects the contact pieces 7 and 7' is disposed in the slider 6. In operation, the slider 6 is moved to bring the contact pieces 7 and 7' into contact with the receiving terminal 4' through the window 5. Thus, when the fusible portion 3*a* of the band fuse 3 is not fused, current flows in the order of the receiving terminal 4, the band fuse 3, the receiving terminal 4, the contact piece 7 (7') as well as the coupling terminal 7*a*, and a conductive member 8 exposedly arranged on the bottom of the recess 2, and hence, a light emitting diode 9 emits light. In an accommodating chamber 4*a* therefor, the receiving terminal 4' on the load side is fixed by an engaging member 4*b* in the protruding direction of the contact piece 7 (7'**).

Incidentally, each band fuse 3 has a pair of sharp-edged terminals **3*b* as illustrated in FIG. 7**.

In the inspection device, the contact pieces 7 and 7' for sensing the propriety of the band fuse come into direct contact with the receiving terminal 4', and each time the contact pieces 7 and 7' come into contact, a force in the same sense as the urging direction of the engagement member **4*b* is exerted on the receiving terminal 4' by the contact pieces 7 and 7'. Therefore, the receiving terminal 4' becomes shaky, and the state of the contact becomes astable. Another problem is that the coupling terminal 7*a* of the contact pieces 7 and 7' is normally held in pressed contact with the conductive member 8** and is apt to undergo elastic deterioration.

SUMMARY OF THE INVENTION

The present invention has been made in order to solve the problems mentioned above, and has for its object to provide a fuse inspection device which can reliably sense the propriety of band fuses.

In one aspect of performance of the present invention, a fuse inspection device having receiving terminals which are arranged in a longitudinal direction of a fuse box body and with which a plurality of band fuses are held in fit engagement, windows which are provided in side walls of accommodating chambers for the respective receiving terminals, a slide knob which slides along the band fuses, and a sensing terminal which moves together with the slide knob and which has one end electrically connected with the receiving terminal through the window and has the other end brought into contact with a common conductive member, electric conduction states of the band fuses being successively sensed by electrically connecting the sensing terminal and the receiving terminals through the movement of the slide knob; is characterized in that a plurality of connecting terminals each of which has one end held in contact with the corresponding receiving terminal through said window are arranged in said fuse box body and in a moving direction of said slide knob, and that said sensing termnal is mounted in said slide knob in ascendible fashion, so that when said one end of said sending terminal has come into contact with any of said connecting terminals, a pressure of the contact between said other end of said sensing terminal and said conductive member rises.

FIGS. **5*a* and 5*b*** are explanatory views each showing the operation of a slide knob in the device.

Figure 6:
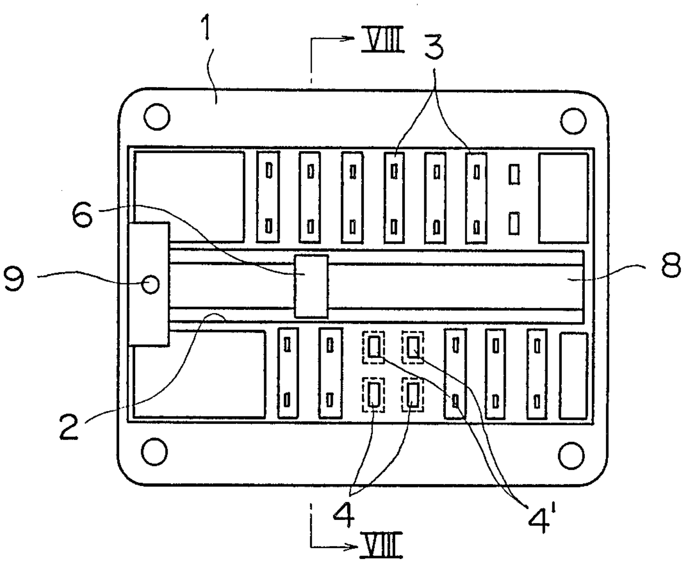
PRIOR ART FIG. 6
Figure 7:
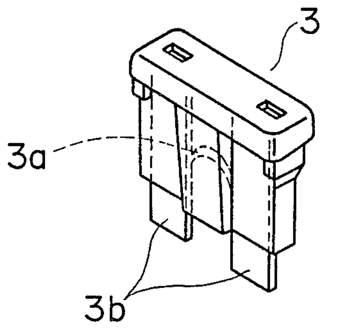
PRIOR ART FIG. 7
Figure 8:
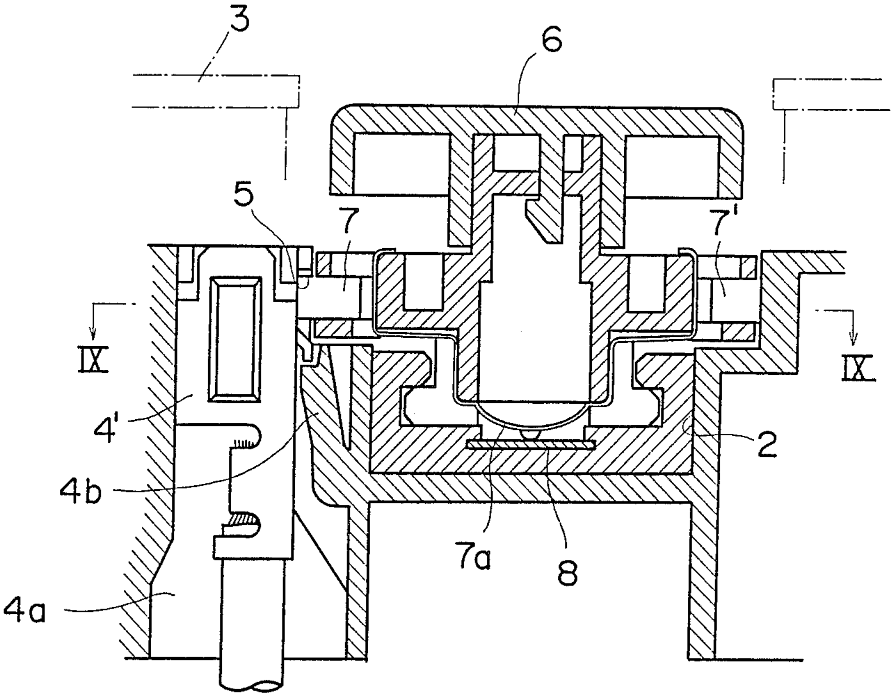
PRIOR ART FIG. 8
Figure 9:
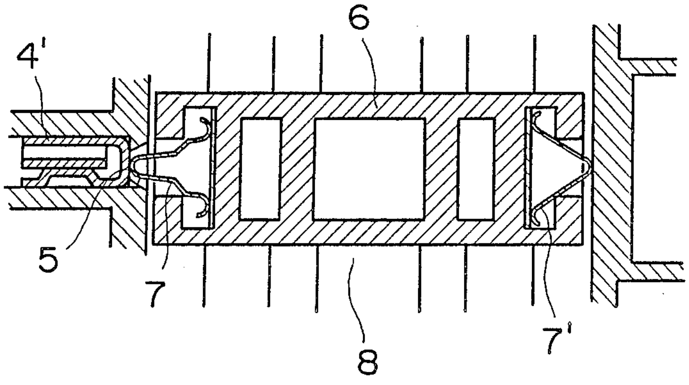
PRIOR ART FIG. 9

FIGS. 6 through 9 show a fuse inspection device in a prior art, in which FIG. 6 is a plan view of the device, FIG. 7 is a perspective view of a band fuse, FIG. 8 is an enlarged sectional view, partly broken away, taken along line VIII—VIII in FIG. 6, and FIG. 9 is a sectional view taken along line IX—IX in FIG. 8.

PREFERRED EMBODIMENT OF THE INVENTION

The present invention will now be concretely described with reference to the drawings illustrative of one embodiment thereof.

Figure 1:
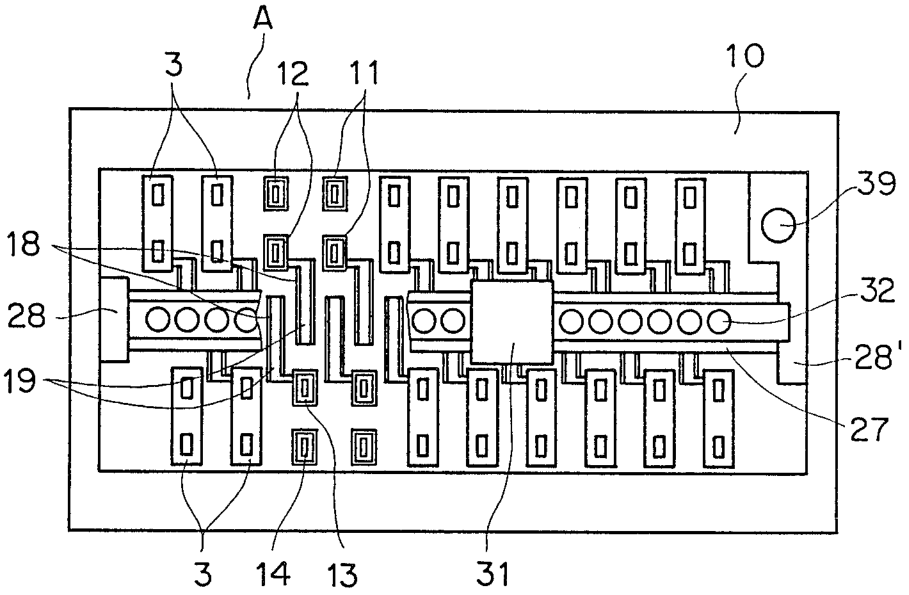
FIG. 1 is a plan view showing an embodiment of the device of the present invention.
Figure 2:
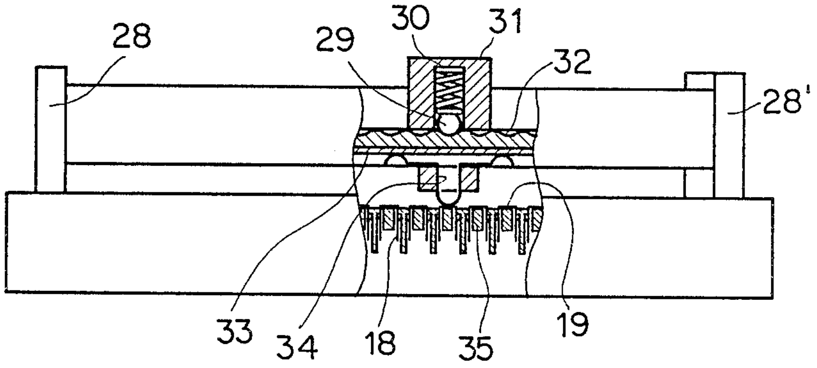
FIG. 2 is a front view, partly in section, showing the device.

In FIGS. 1 and 2, letter A indicates a fuse box, and numeral 10 indicates the body thereof. In the body 10, a plurality of sets of fuse inserting ports 11 are arranged zigzag on both the sides and in the longitudinal direction thereof. Band fuses 3 are mounted on the respective sets of fuse inserting ports 11.

Figure 3:
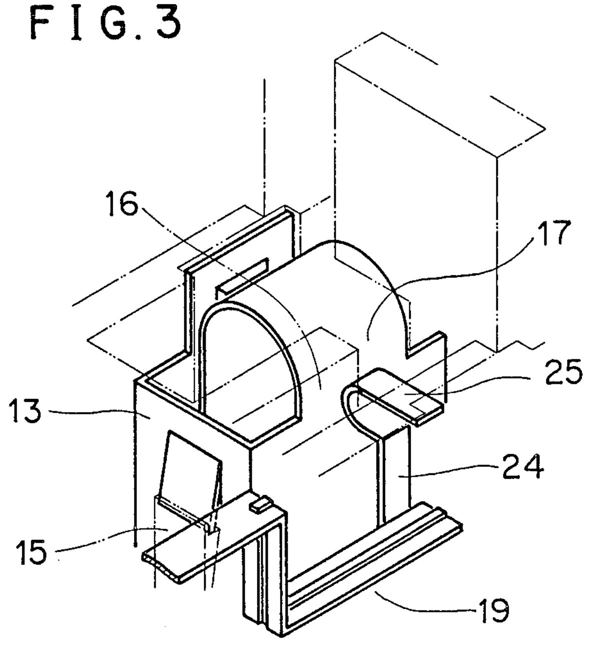
FIG. 3 is an enlarged perspective view showing the mutual relationship between a receiving terminal and a connecting terminal in the device.

In each set of fuse inserting ports 11, two terminal accommodating chambers 12 are defined. In each of the chambers, the corresponding one of receiving terminals 13 and 14 which are brought into fit engagement with one pair of sharp-edged terminals **3*b* of the band fuse 3 is fixed by a flexible engagement arm 15 as shown in FIG. 3. The receiving terminal 13 (14) is urged in a direction orthogonal to the longitudinal direction of the body 10 by means of the engagement arm 15. Of the pair of receiving terminals 13 and 14, one 13 on the inner side of the body 10 is connected to a load side by an electric wire not shown, and the other 14 on the outer side is connected to a power source side. As to the terminal accommodating chamber 12 which accommodates the inner receiving terminal 13, a window 17 is provided in a side wall 16 on a side orthogonal to the longitudinal direction of the body 10, so that part of the receiving terminal 13** is exposed.

Figure 4:
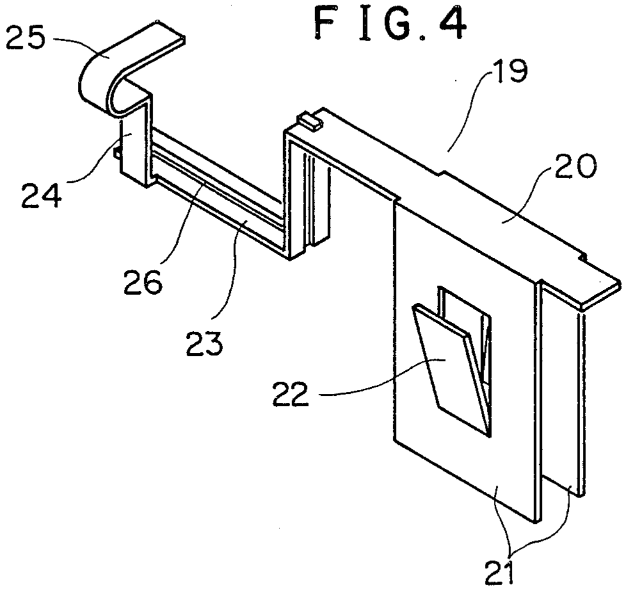
FIG. 4 is a perspective view of the connecting terminal in the device.

In the central part of the body 10, a plurality of slit-like engagement holes 18 are provided in the longitudinal direction, and connecting terminals 19 are fixed in engagement holes 18. Two of the engagement holes 18 form one set, and they are disposed alternately in correspondence with the fuse inserting ports 11. As shown in FIG. 4, the connecting terminal 19 is so configured that engagement rances 22 are formed in the leg plates 21 of a base plate 20 on both the sides thereof in a cut and raised manner, that the front-end free edge of the base plate 20 is bent in the shape of letter L ahead of the leg plates 21, whereupon a curved contact plate 25 is formed through an elastic support plate 24 extending upwards from the side edge of the resulting bent plate 23, and that a reinforcement rib 26 is provided on the bent plate 23. When the leg plates 21 of the connecting terminal 19 are inserted in the engagement hole 18, the engagement rances 22 are fixed in engagement with protuberances (not shown) in the hole 18, and simultaneously, the bent contact plate 25 is brought into elastic contact with the receiving terminal 13 through the window 17 by the elastic support plate 24.

In addition, a guide 27 U-shaped in cross section is suspended over the connecting terminals 19 by support members 28 and 28' which are provided at both the ends of the body 10. A slide knob 31 which includes therein a rotatable ball 29 and a coiled spring 30 urging the ball 29 downwards is installed on the guide 27, and semi-spherical positioning indents 32 for the ball 29 are provided in the inner bottom part of the guide 27 so as to lie just above the respective connecting terminals 19. Besides, a conductive plate 33 is spliced to the rear surface of the guide 27, and a sensing terminal 35 is ascendibly attached to the lower part of the slide knob 31. This sensing terminal 35 is made of a thin plate which is elastic. It consists of a U-shaped bent projection 36 which can ascend and descend relative to the vertical hole 34 of the slide knob 31, and elastic contact plates 37 which join to both the sides of the bent projection 36 in the shape of wings. Curved pieces 38 are formed at the end parts of the respective elastic contact plates 37. Further, the conductive plate 33 is connected to a ground point not shown, via a light emitting diode 39.

Next, the method of operating the fuse box A will be described.

Figure 5A:
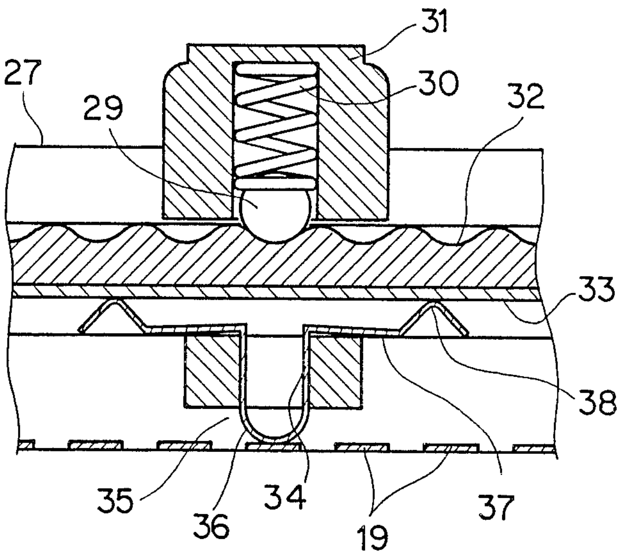

In operating the fuse box, the band fuses 3 are inserted into the fuse inserting ports 11 to be connected with the receiving terminals 13 and 14, and the power source is turned on. Under this state of use, the slide knob 31 is moved horizontally along the guide 27 as illustrated in FIGS. 5*a* and 5*b*.

When the knob 31 is positioned owing to the engagement between the ball 29 and the positioning indent 32, the bent projection 36 of the sensing terminal 35 is pushed up in contact with the connecting terminal 19, and hence, the curved pieces 38 of the elastic contact plates 37 of the sensing terminal come into elastic contact with the conductive plate 33 on the rear surface of the guide 27 under an appropriate contact pressure. On the other hand, the connecting terminal 19 has the curved contact plate 25 thereof normally held in contact with the receiving terminal 13 as illustrated in FIG. 3. Accordingly, unless the band fuse 3 is not fused, current flows in the order of the sensing terminal 35, conductive plate 33 and light emitting diode 39 via the receiving terminal 14, band plate 3, receiving terminal 13 and connecting terminal 19, and the diode 39 emits light. In contrast, if the fusible portion 3*a* of the band fuse 3 is fused, the light emitting diode 39 does not emit light. Since the positioning indents 32 of the guide 27 correspond to the fuse inserting ports 11 (namely, the band fuses 3) staggeredly arranged on both the sides of the fuse box body 10, the fused or unfused states of the band fuses 3 on both the sides can be successively sensed under the state of use of the fuse box A by sliding the knob 31.

Figure 5B:
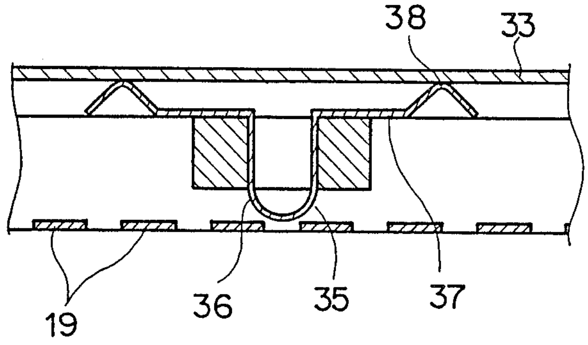

When the knob 31 is not positioned, the sensing terminal 35 is in an open state without contact with the connecting terminal 19 as illustrated in FIG. 5*b*. At this position, accordingly, the propriety of the fuse is not sensed.

In moving the knob 31, a downward force acts on the base plate 20 of the connecting terminal 19 through the ascent and descent of the bent projection 36 of the sensing terminal 35. Since, however, the direction of this force is orthogonal to the elastic support plate 24 of the connecting terminal 19, the contact pressure between the receiving terminal 13 and the curved contact plate 25 of the connecting terminal 19 is not affected at all. Accordingly, the receiving terminal 13 does not undergo any influence ascribable to the movement of the knob 31 as well as the sensing terminal 35, and the receiving terminal 13 is prevented from becoming shaky into an astable contact state as in the prior art.

Moreover, the connecting terminals 19, sensing terminal 35 and conductive plate 33 which are members for electrically connecting the receiving terminals 13 with the light emitting diode 39 are all protected from outside by the guide 27. Therefore, inferior contact states attributed to the deposition of dust etc. are difficult to take place, and deformations due to external forces or short-circuits with the components of other electric appliances etc. are not apprehended.

As understood from the foregoing, according to the fuse inspection device of the present invention, connecting terminals are disposed separately from receiving terminals for band fuses and a sensing terminal associated with a slide knob, whereby the receiving terminals are prevented from being influenced by the movement of the sensing terminal, and the sensing terminal is mounted in the slide knob in ascendible fashion, whereby the sensing terminal is normally held open, and when it has come into contact with the connecting terminal, the contact pressure thereof with a conductive member rises. Therefore, an inferior contact condition due to the shaky receiving terminal or the elastic deterioration of the sensing terminal as in the prior art is difficult to arise, and the propriety of the fuse can be reliably sensed.

What is claimed is:

1. A fuse inspection device comprising:

a fuse box;

plural pairs of receiving terminals arranged within said fuse box, each pair having a first receiving terminal and a second receiving terminal for receiving a fuse therein;

connecting terminals each having a base plate and a first elastic contact element, said connecting terminals being arranged substantially in an identical plane within said fuse box such that the base plate of each connecting terminal is aligned in a row with the base plates of other connecting terminals with spacings therebetween, said first elastic contact element being urged in a direction parallel to said identical plane against each first receiving terminal; and slide contact means slidably provided along the base plates of said connecting terminals and having a second elastic contact element urged in a direction perpendicular to said identical plane toward said row for selectively contacting one of said base plates at one end thereof and connected at another end thereof to light emitting means.

2. A fuse inspection device according to claim 1, wherein each first elastic contact is urged against a respective first receiving terminal in a direction of said row of the first receiving terminals.

3. A fuse inspection device according to claim 2, wherein said pairs of first and second receiving terminals are arranged in parallel with said row of the base plates of the connecting terminals.

4. A fuse inspection device according to claim 1, wherein said slide contact means includes a guide suspended over the connecting terminals and slide knob slidably attached to said guide.

5. A fuse inspection device according to claim 4, wherein said second elastic contact element includes a leaf spring contact installed in said slide knob and a conductive plate provided in parallel with said guide, said conductive plate being connected to said light emitting means.

* * * * *